(12) United States Patent
Fusco et al.

(10) Patent No.: US 11,800,728 B2
(45) Date of Patent: Oct. 24, 2023

(54) LUMINESCENT SOLAR CONCENTRATORS OF NEUTRAL COLORATION

(71) Applicant: ENI S.P.A., Rome (IT)

(72) Inventors: Roberto Fusco, Novara (IT); Liliana Gila, Novara (IT); Luciano Caccianotti, Novara (IT); Antonio Alfonso Proto, Novara (IT)

(73) Assignee: ENI S.P.A., Rome (IT)

( * ) Notice: Subject to any disclaimer, the term of this patent is extended or adjusted under 35 U.S.C. 154(b) by 0 days.

(21) Appl. No.: 17/047,803

(22) PCT Filed: Apr. 17, 2019

(86) PCT No.: PCT/IB2019/053186
§ 371 (c)(1),
(2) Date: Oct. 15, 2020

(87) PCT Pub. No.: WO2019/202529
PCT Pub. Date: Oct. 24, 2019

(65) Prior Publication Data
US 2021/0111360 A1 Apr. 15, 2021

(30) Foreign Application Priority Data
Apr. 19, 2018 (IT) .................. 102018000004707

(51) Int. Cl.
*H10K 30/80* (2023.01)
*H01L 31/055* (2014.01)
(Continued)

(52) U.S. Cl.
CPC .......... *H10K 30/80* (2023.02); *H01L 31/055* (2013.01); *H02S 20/22* (2014.12); *H10K 85/656* (2023.02); *H10K 85/6574* (2023.02)

(58) Field of Classification Search
CPC . H01L 31/055; H01L 31/048; H01L 31/0481; H01L 31/0488; H02S 20/22–26; H02S 40/22
(Continued)

(56) References Cited

U.S. PATENT DOCUMENTS

2009/0205701 A1* 8/2009 Govaerts ............... H01L 31/055
136/247
2011/0253198 A1* 10/2011 Patrick .................. H01L 31/055
136/247
(Continued)

FOREIGN PATENT DOCUMENTS

WO  WO-2015023574 A1 * 2/2015 ........... H01L 31/055
WO  WO-2017207544 A1 * 12/2017 ........... H01L 31/055

OTHER PUBLICATIONS

Refractive index database < https://refractiveindex.info/?shelf=organic&book=poly(methyl_methacrylate)&page=Szczurowski> (Year: 2013).*
(Continued)

*Primary Examiner* — Andrew J Golden
(74) *Attorney, Agent, or Firm* — Ruggiero McAllister & McMahon LLC

(57) ABSTRACT

Luminescent solar concentrator (L8C) of neutral coloration comprising: —at least one first sheet comprising a matrix of a transparent material and at least one first photoluminescent organic compound having an absorption interval within the range 400 nm to 550 nm, preferably within the range 420 nm to 500 mrs, and an emission interval within the range 500 nm to 650 nm, preferably within the range 520 mn to 620 nm; —at least one second sheet comprising a matrix of a transparent material and at least one second photoluminescent organic compound having an absorption interval within the range 420 nm to 650 nm, preferably within the range 480 nm to 600 nm, and an emission interval within the range 580
(Continued)

nm and 750 nm, preferably within the range 600 nm and 700 nm; —at least one third sheet comprising a matrix of a transparent material and at least one third, optionally photoluminescent, organic compound having an absorption interval within the range 550 nm to 750 nm, preferably within the range 570 nrn to 700 nm, and an emission interval within the range 700 nrn to 900 nm, preferably within the range 740 nm to 850 nm. Said luminescent solar concentrator of neutral coloration may be used advantageously in various applications requiring the production of electrical energy by exploiting light energy, in particular solar radiation energy such as, for example: building/integrated photovoltaic (BiPV) systems, photovoltaic windows, greenhouses, photo bioreactors, noise barriers, lighting engineering, design, advertising, automotive industry.

15 Claims, 3 Drawing Sheets

(51) Int. Cl.
*H02S 20/22* (2014.01)
*H10K 85/60* (2023.01)

(58) Field of Classification Search
USPC .......................................... 136/247
See application file for complete search history.

(56) References Cited

U.S. PATENT DOCUMENTS

| | | | | |
|---|---|---|---|---|
| 2012/0024345 | A1* | 2/2012 | Reisfeld | H01L 31/055 136/247 |
| 2012/0138125 | A1* | 6/2012 | Hammermann | H01L 31/055 136/247 |
| 2013/0074930 | A1* | 3/2013 | Lichtenstein | H01L 31/055 252/589 |
| 2013/0098443 | A1* | 4/2013 | Azumada | H01L 31/055 136/257 |
| 2014/0083481 | A1* | 3/2014 | Hebrink | H02S 20/26 136/246 |
| 2014/0352762 | A1* | 12/2014 | Carter | H01L 31/055 136/247 |
| 2015/0129018 | A1* | 5/2015 | Declerck | H01L 31/055 136/251 |
| 2015/0144191 | A1* | 5/2015 | Declerck | H01L 31/055 136/257 |
| 2016/0108310 | A1 | 4/2016 | Gu et al. | |
| 2016/0327714 | A1 | 11/2016 | Patrick et al. | |

OTHER PUBLICATIONS

Brackmann, Lambdachrome Laser Dyes, 2000, Lambda Physik AG D-37079 Goettingen Germany, Third Edition. (Year: 2000).*
Definition of Sheet <https://web.archive.org/web/20180220141713/https://dictionary.cambridge.org/us/dictionary/english/sheet> Feb. 2018 (Year: 2018).*
Definition of Layer <https://web.archive.org/web/20180122130408/https://dictionary.cambridge.org/us/dictionary/english/layer> Jan. 2018 (Year: 2018).*
International Search Report dated Jun. 25, 2019 for PCT application No. PCT/IB2019/053186.
Written Opinion dated Jun. 25, 2019 for PCT application No. PCT/IB2019/053186.

* cited by examiner

LUMINESCENT SOLAR CONCENTRATORS OF NEUTRAL COLORATION

CROSS-REFERENCE TO RELATED APPLICATIONS

The present application is a national stage application based upon PCT International Application No. PCT/IB2019/053186, filed Apr. 17, 2019, which claims priority based on Italy Application Serial No. 102018000004707, filed Apr. 19, 2018, the disclosures of which are incorporated herein by reference in their entireties.

FIELD OF THE DISCLOSURE

The present disclosure relates to a luminescent solar concentrator (LSC) of neutral coloration.

More particularly, the present disclosure relates to a luminescent solar concentrator (LSC) of neutral coloration comprising at least one first sheet comprising a matrix of a transparent material and at least one first photoluminescent organic compound; at least one second sheet comprising a matrix of a transparent material and at least one second photoluminescent organic compound; at least one third sheet comprising a matrix of a transparent material and at least one third, optionally photoluminescent, organic compound; said first, second and third organic compounds having specific absorption and emission intervals.

Said luminescent solar concentrator of neutral coloration may be used advantageously in various applications requiring the production of electrical energy by exploiting light energy, in particular solar radiation energy such as, for example: building—integrated photovoltaic (BIPV) systems, photovoltaic windows, greenhouses, photobioreactors, noise barriers, lighting engineering, design, advertising, automotive industry.

DESCRIPTION OF THE RELATED ART

In the prior art, one of the principal limitations on the exploitation of solar radiation energy is represented by the capacity of photovoltaic devices (or solar devices) to optimally absorb exclusively radiation having wavelengths that fall within a restricted spectrum interval.

Given a spectrum interval of solar radiation extending from wavelengths of about 300 nm to wavelengths of about 2500 nm, photovoltaic cells (or solar cells) based on crystalline silicon, for example, present an optimal energy conversion zone within the interval 900 nm-1100 nm, whereas polymeric photovoltaic cells (or solar cells) are susceptible to damage if exposed to radiation with wavelengths lower than about 500 nm, on account of induced photodegradation phenomena, which become significant below this limit. The efficiency of state-of-the art photovoltaic devices (or solar devices) is typically maximum within the region of the spectrum between 570 nm and 680 nm (yellow-orange).

The disadvantages mentioned previously entail a limited external quantum efficiency (EQE) of photovoltaic devices (or solar devices), defined as the ratio of the number of electron-hole pairs generated within the semiconductor material of photovoltaic devices (or solar devices) to the number of photons incident upon said photovoltaic devices (or solar devices).

To improve the external quantum efficiency (EQE) of photovoltaic devices (or solar devices) instruments have been developed which, when positioned between the source of light radiation (the sun) and photovoltaic devices (or solar devices), selectively absorb the incident radiation having wavelengths outside the effective spectrum of said photovoltaic devices (or solar devices), emitting the absorbed energy in the form of photons of wavelength comprised within the effective spectrum. Said instruments are called luminescent solar concentrators (LSCs). When the energy of the photons re-emitted by the luminescent solar concentrators (LSCs) is greater than that of the incident photons, the photoluminescence process, comprising the absorption of solar radiations and the successive re-emission of shorter-wavelength photons, is also called an "up-conversion" process. Conversely, when the energy of the photons emitted by the luminescent solar concentrators (LSCs) is inferior to that of the incident photons, the photoluminescence process is defined as a "down-conversion" (o "down-shifting") process.

Said luminescent solar concentrators (LSCs) generally consist of large sheets of a material that is transparent to solar radiation (for example, polymeric materials or glass), within which are dispersed or chemically bonded to said polymeric materials, or deposited on the surface of said polymeric materials or glass, photoluminescent compounds that act as spectrum converters. Through an effect of the optical phenomenon of total reflexion, the radiation emitted by the photoluminescent compounds is "guided" towards the thin edges of the sheet, where it is concentrated on photovoltaic cells (or solar cells) positioned thereon. In this way, large surface areas of low-cost materials (the photoluminescent sheets) may be used to concentrate the light onto small surface areas of high-cost materials [photovoltaic cells (or solar cells)].

The photoluminescent compounds may be deposited on the glass or polymeric material support in the form of a thin film or, in the case of the polymeric materials, they may be dispersed within the polymeric matrix. Alternatively, the polymeric matrix may be functionalized directly with photoluminescent chromophore groups.

As is known, the above-mentioned photoluminescent compounds may be organic in nature (for example, compounds comprising aromatic rings), or inorganic in nature (for example, quantum dots).

Organic photoluminescent compounds generally have absorption intervals and emission intervals within the visible zone (400 nm-800 nm), the most energetic zone of the solar spectrum. In order to exploit this energy better, with a resultant improvement in the performance of luminescent solar concentrators (LSCs), systems have been used comprising different photoluminescent compounds capable of absorption and emission within various zones of the visible spectrum, thus covering a broader zone thereof than that covered by a single photoluminescent compound, i.e. the so-called "multi-dye systems", which generally comprise photoluminescent compounds that absorb and emit at given wavelengths, preferably at wavelengths within the range 400 nm to 700 nm, in such a way that the energy emitted by one photoluminescent compound is reabsorbed by another photoluminescent compound and subsequently re-emitted, and so on, in such a way as to exploit a broader spectrum interval of the solar radiation.

For example, at the end of the 70s, Schwartz B. A. et al., in "*Optics Letters*" (1977), Vol. 1, No. 2, pag. 73-75, describe a planar solar concentrator consisting of a sheet made of poly(methyl methacrylate) (PMMA) comprising a mixture of two photoluminescent compounds, i.e. Coumarin 6 and Rhodamine 6G (in a concentration equal to about 104 M). The current produced by a silicon photovoltaic cell positioned on one edge of said sheet was measured and compared with that of a reference planar solar concentrator consisting of a poly(methyl methacrylate) (PMMA) sheet comprising Coumarin 6 only (in a concentration equal to about $10^{-4}$ M). The planar solar concentrator consisting of a sheet made of poly(methyl methacrylate) (PMMA) comprising the mixture of the two photoluminescent compounds was found to allow production of current equal to about twice that produced by the poly(methyl methacrylate) (PMMA) sheet comprising Coumarin 6 only, demonstrating that Coumarin 6 (an electron-donor compound) was capable of absorbing a portion of the solar energy and transferring it to Rhodamine 6G (an electron-acceptor compound), which was capable of re-emitting it at a higher wavelength covering an interval of the solar spectrum greater than that covered by the Coumarin 6 alone or by the Rhodamine 6G alone.

Bailey S. T. et al., in "*Solar Energy Materials & Solar Cells*" (2007), Vol. 91, pag. 67-75, describe a luminescent solar concentrator (LSC) composed of a thin film of methyl acrylate/ethyl acrylate copolymer comprising one, two or three photoluminescent compound/s. Because the thickness of the films is in general smaller than that of the sheets (i.e. μm vs mm), the aim was to maximize the closeness of the molecules to obtain a non-radiative energy transfer (FRET—"Forster Resonance Energy Transfer") so as to improve performance. The photoluminescent compounds used were derived from 4,4-difluoro-4-bora-3a,4a,-diaza-s-indacene (BODYPY) respectively BODIPY 494/505, BODIPY 535/558 and BODIPY 564/591 (where the numbers correspond to the absorption and emission wavelengths, respectively). Each film was prepared by casting depositing a solution of the dye/s on the thin film of the above polymer at a concentration equal to $1 \times 10^{-2}$ M. The luminescent solar concentrator (LSC) comprising three different photoluminescent compounds was found to absorb 70% of the photons within the 350 nm-650 nm interval, about 1.5 times more than the luminescent solar concentrator (LSC) comprising the best of the individual dyes and the device, prepared by positioning two PV cells on an edge of the sheet demonstrated an efficiency increase of 30%.

Goldschmidt J. C. et al., in "*Solar Energy Materials & Solar Cells*" (2009), Vol. 93, pag. 176-182, again with the intention of improving the efficiency of luminescent solar concentrators, describe a device obtained by combining two luminescent solar concentrators, each comprising a different photoluminescent compound. The final device was formed of two stacked luminescent solar concentrators each 2×2× 0.3 cm in size and there were four GaInP solar cells, one per side: each individual solar cell was 6 mm in height, so that each solar cell received light from both of said concentrators. The device with the two dye luminescent solar concentrators demonstrated an efficiency of 6.7%, whereas the device with a single luminescent solar concentrator comprising the most efficient of the photoluminescent compounds used demonstrated an efficiency of 5.1%.

Liu C. et al., in "*Journal of Optics*" (2015), Vol. 17, 025901, describe a device obtained by combining three luminescent solar concentrators each comprising a different photoluminescent compound, in particular, a red photoluminescent compound (Lumogen® F Red 305), a green photoluminescent compound (Coumarin 6) and a blue, perylene photoluminescent compound, respectively. Glued on the edges of each sheet are strings of monocrystalline silicon solar cells of dimensions 5×0.5 cm: the device obtained, composed of the three superimposed sheets and the solar panels, demonstrated a power conversion efficiency of 1.4%, said efficiency being 16.7% greater than that obtained with a device comprising the luminescent solar concentrator with only the red photoluminescent compound (Lumogen® F Red 305).

Earp A. A. et al., in "*Solar Energy Materials & Solar Cells*" (2004), Vol. 84, pag. 411-426, describe a device comprising a luminescent solar concentrator composed of three poly(methyl methacrylate) (PMMA) sheets comprising three different photoluminescent compounds, "violet", "green" and "pink", capable of generating white light. Said luminescent solar concentrator was fixed on the roof of a building or close to the windows of the rooms and the waveguides emitted by each dye are collected and connected into a single waveguide of transparent poly (methyl methacrylate) (PMMA) of more than 5 metres that is able to reach and illuminate the darkest zones of the building.

The luminescent solar concentrators (LSCs) mentioned above, which use a wide variety of dyes, while being capable of improved performances, are not however with neutral coloration.

According to the European Directives UE2010/31/EU and 2012/27/EU, all new buildings will need to have an energy consumption close to zero (near Zero-Energy Building—nZEB), that is, they will not only need to be designed so as to consume the least amount of energy possible, they will also have to produce the energy that they consume. These directives will come into force from 2020 for new houses, but for public buildings as early as 2018.

Thanks to their great versatility due to the transparency, flexibility and the myriad shapes and colours that are possible, luminescent solar concentrators (LSCs) are seen as potential structural energy components for use in building-integrated photovoltaic (BIPV) systems, with moreover a considerably improved aesthetic and design value by comparison with conventional silicon photovoltaic panels.

The colour and the degree of transparency may be modulated by varying the type and concentration of the photoluminescent compound/s used, and are dependent upon the final use of the luminescent solar concentrator (LSC).

In particular, by virtue of their transparency, luminescent solar concentrators (LSCs) are potential candidates in the construction of photovoltaic windows. For this use, however, a neutral coloration could be preferable. Indeed, the presence of an intensely coloured window within a room could, in the daytime, influence the degree and quality of the room's luminosity and in consequence make staying in the room an unpleasant experience: consequently, the presence of a photovoltaic window comprising a luminescent solar concentrator (LSC) capable of imparting a neutral coloration thereto would be desirable.

Studies have therefore been carried out to obtain luminescent solar concentrators (LSCs) of neutral coloration.

For example, the American patent application US 2014/0130864 describes a transparent solar concentrator comprising: a transparent wave guide [for example, poly (methyl methacrylate) (PMMA)]; and a transparent film including a plurality of transparent luminophores (for example, clusters of nanocrystals of metal halides or thiocarbocyanine salts or naphthalocyanine derivatives), said luminophores being capable of absorbing light within the ultraviolet spectrum and emitting the light within the near-infrared spectrum. The above mentioned transparent solar concentrator is said to be advantageously usable in photovoltaic windows.

The American patent application US 2014/0283896 describes a transparent luminescent solar concentrator comprising luminophores incorporated within a waveguide matrix [for example, (poly)-butyl methacrylate-co-methyl methacrylate (PBMMA)], which are capable of both absorbing and emitting selectively light within the near infrared spectrum (for example, cyanine or salts thereof) so as to enable the functioning of photovoltaic cells applied to at least one side or incorporated into said waveguide matrix. The above mentioned luminescent solar concentrator is said to be highly transparent to the human eye, and is therefore advantageously usable in photovoltaic windows, greenhouses, car windows, aeroplane windows, and the like.

The international patent application WO 2016/116803 describes a luminescent solar concentrator comprising a polymer matrix [for example, poly(methyl methacrylate) (PMMA)] or a glass matrix comprising colloidal nanocrystals, said colloidal nanocrystals being nanocrystals of at least one ternary chalcogenide based on metals of grup IB and IIIB (group 11 and 16, respectively, in the IUPAC nomenclature) and of at least one chalcogen of group IV (group 16 in the IUPAC nomenclature). The above mentioned luminescent solar concentrator is said to be colourless, i.e. it is said to have a neutral coloration (shades of grey similar to normal optical filters of neutral optical density).

Meinardi F. et al., in "*Nature Photonics*" (2017), Vol. 11, pag. 177-186, describe a luminescent solar concentrator comprising quantum dots of silicon which, according to their dimensions, are capable of absorbing within a broad spectrum of solar radiation and of emitting within the infrared spectrum and considerably reducing the efficiency losses due to reabsorption. Said luminescent solar concentrator is said to have an optical efficiency of 2.85% and a high degree of transparency across the visible spectrum (70% transmittance) and in consequence may be advantageously used in building-integrated photovoltaic (BIPV) systems, in particular, in photovoltaic windows.

However, the above-mentioned luminescent solar concentrators of neutral coloration may present some disadvantages. For example, the use of inorganic compounds or of organic compounds capable of absorbing light within the ultraviolet spectrum and of emitting the light within the near-infrared spectrum outside the visible spectrum, does not permit exploitation of a large part of the solar spectrum.

Since the use of luminescent solar concentrators (LSCs) of neutral coloration in various applications necessitating the production of electrical energy via exploitation of light energy, in particular the energy of solar radiation such as, for example: building/integrated photovoltaic (BIPV) systems, photovoltaic windows, greenhouses, photobioreactors, noise barriers, lighting engineering, design, advertising, automotive industry, is of considerable interest, the production of new luminescent solar concentrators (LSCs) of neutral coloration is similarly of great interest.

SUMMARY OF THE DISCLOSURE

The Applicant has posed the problem of finding luminescent solar concentrators (LSCs) of neutral coloration that are capable of performances comparable to or even better than the known ones, in particular in terms of the power generated by the photovoltaic devices (or solar devices) in which they are used.

The Applicant has now found luminescent solar concentrators (LSCs) of neutral coloration comprising at least one first sheet comprising a matrix of a transparent material and at least one first photoluminescent organic compound; at least one second sheet comprising a matrix of a transparent material and at least one second photoluminescent organic compound; at least one third sheet comprising a matrix of a transparent material and at least one third, optionally photoluminescent, organic compound; said first, second and third photoluminescent compounds having specific absorption and emission intervals. In particular, the Applicant has discovered that by stacking said various sheets, it is possible to obtain luminescent solar concentrators (LSCs) of neutral coloration capable of performances that are comparable or even better than the known ones, in particular in terms of the power generated by the photovoltaic devices (or solar devices) in which they are used. Furthermore, said luminescent solar concentrators (LSCs) of neutral coloration are advantageously usable in various applications necessitating the production of electrical energy via exploitation of light energy, in particular the energy of solar radiation such as, for example: building-integrated photovoltaic (BIPV) systems; photovoltaic windows; greenhouses; photobioreactors; noise barriers; lighting engineering; design; advertising; automotive industry.

The object of the present disclosure is therefore a luminescent solar concentrator (LSC) of neutral coloration comprising:
- at least one first sheet comprising a matrix of a transparent material and at least one first photoluminescent organic compound having an absorption interval within the range 400 nm to 550 nm, preferably within the range 420 nm to 500 nm, and an emission interval within the range 500 nm to 650 nm, preferably within the range 520 nm to 620 nm;
- at least one second sheet comprising a matrix of a transparent material and at least one second photoluminescent organic compound having an absorption interval within the range 420 nm to 650 nm, preferably within the range 480 nm to 600 nm, and an emission interval within the range 580 nm to 750 nm, preferably within the range 600 nm to 700 nm;
- at least one third sheet comprising a matrix of a transparent material and at least one third, optionally photoluminescent, organic compound having an absorption interval within the range 550 nm to 750 nm, preferably within the range 570 nm to 700 nm, and an emission interval within the range 700 nm to 900 nm, preferably within the range 740 nm to 850 nm.

BRIEF DESCRIPTION OF THE DISCLOSURE

DETAILED DESCRIPTION OF THE DISCLOSURE

Figure 1:
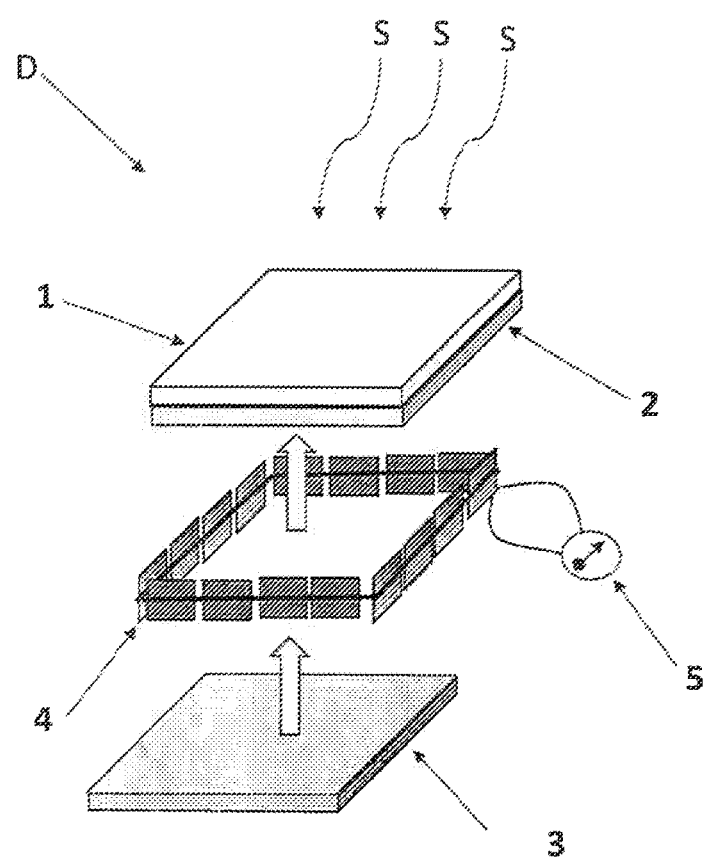
FIG. 1 is an exploded, perspective view of an assembly of a luminescent solar concentrator (LSC) (D) in accordance with the present disclosure.

For the purpose of the present description and of the claims which follow, the definitions of the numerical intervals always comprise the extremes unless otherwise specified.

For the purpose of the present description and of the claims which follow, the term "comprising" also includes the terms "which consists essentially of" or "which consists of".

According to a preferred embodiment of the present disclosure, said at least one first, at least one second and at least one third sheet, have one upper surface, one lower surface and one or more outer sides. According to one embodiment, said at least one first, at least one second and at least one third sheet, may have one outer side (e.g., they may be circular), three, four, five, six, seven, or more sides. According to one embodiment, said at least one first, at least one second and at least one third sheet, may have a lower surface distanced from the upper surface into which the outer side/s extend/s from the upper surface to the lower one.

According to a preferred embodiment of the present disclosure, said at least one first, at least one second and at least one third sheet, are stacked one in relation to the other in such a way that the larger surfaces of said at least one first, at least one second and at least one third sheet, are in direct contact one with the other.

According to a further preferred embodiment of the present disclosure, the lower larger surface of said at least one first sheet is in direct contact with the upper larger surface of said at least one second sheet, the lower larger surface of said at least one second sheet is in direct contact with the upper larger surface of said at least one third sheet.

For the purpose of the present description and of the claims which follow, the term "in direct contact" means that no other elements are interposed between said at least one first, at least one second and at least one third sheet.

For the purpose of improving the performances of photovoltaic devices (or solar devices) in which the luminescent solar concentrators (LSCs) of neutral coloration that are the object of the present disclosure are used, in particular in terms of power generated by said photovoltaic devices (or solar devices), the order in which said at least one first, at least one second and at least one third sheet are stacked is important.

According to a further preferred embodiment of the present disclosure, the upper larger surface of said at least one first sheet is closer to the photon source and the lower larger surface of said at least one third sheet is further away from the photon source.

According to a preferred embodiment of the present disclosure, said transparent material may be selected, for example, from: transparent polymers such as, for example, poly(methyl methacrylate) (PMMA), polycarbonate (PC), poly(isobutyl methacrylate), poly(ethyl methacrylate), poly (allyl diglycol carbonate), polymethacrylimide, polycarbonate ether, polyethylene terephthalate, polyvinyl butyral, ethylene-vinyl acetate copolymers, ethylene-tetrafluoroethylene copolymers, polyimide, polyurethane, styrene-acrylonitrile copolymers, styrene-butadiene copolymers, polystyrene, methyl methacrylate-styrene copolymers, polyethersulfone, polysulfone, cellulose triacetate, transparent and impact-resistant crosslinked acrylic compositions consisting of a fragile matrix (I) having a glass transition temperature ($T_g$) above 0° C. and elastomeric domains having dimensions smaller than 100 nm which consist of macromolecular sequences (II) having a flexible nature with a glass transition temperature ($T_g$) below 0° C. described, for example, in US patent application US 2015/0038650 (hereinafter referred to, for greater simplicity, as PPMA-IR), or mixtures thereof; transparent glass such as, for example, silica, quartz, alumina, titanium, or mixtures thereof. Poly (methyl methacrylate) (PMMA), PMMA-IR, or mixtures thereof, are preferred. Preferably, said transparent material may have a refractive index within the range 1.30 to 1.70.

According to a preferred embodiment of the present disclosure, said at least one first photoluminescent organic compound may be selected, for example, from:

benzothiadiazole compounds such as, for example, 4,7-di(thien-2'-yl)-2,1,3-benzothiadiazole (DTB), or mixtures thereof;

disubstituted benzoheterodiazole compounds such as, for example, 4,7-bis[5-(2,6-dimethylphenyl)-2-thienyl] benzo[c]1,2,5-thiadiazole (MPDTB), 4,7-bis[5-(2,6-di-iso-propylphenyl)-2-thienyl]benzo[c]1,2,5-thiadiazole (IPPDTB), 4,7-bis[4,5-(2,6-dimethylphenyl)-2-thienyl]benzo[c]1,2,5-thiadiazole (2MPDTB), or mixtures thereof;

disubstituted diaryloxybenzoheterodiazole compounds such as, for example, 5,6-diphenoxy-4,7-bis(2-thienyl)-2,1,3-benzothiadiazole (DTBOP), 5,6-diphenoxy-4,7-bis[5-(2,6-dimethylphenyl)-2-thienyl]benzo[c]1,2, 5-thiadiazole (MPDTBOP), 5,6-diphenoxy-4,7-bis[5-(2,5-dimethylphenyl)-2-thienyl]benzo[c]1,2,5-thiadiazole (PPDTBOP), 5,6-diphenoxy-4,7-bis[5-(2,5-dimethylphenyl)-2-thienyl]benzo[c]-1,2,5-thiadiazole (PPDTBOP), 5,6-diphenoxy-4,7-bis[5-(2,6-diisopropyl-phenyl)-2-thienyl]benzo[c]1,2,5-thiadiazole (IPPDTBOP), or mixtures thereof;

perylene and perylenimide compounds such as, for example, compounds known by the commercial name Lumogen® F083, Lumogen® F170, Lumogen® F240, from Basf, or mixtures thereof;

benzopyranone compounds such as, for example, compounds known by the commercial name Coumarin 6, Coumarin 30, of Acros, or mixtures thereof;

or mixtures thereof.

According to a further preferred embodiment of the present disclosure, said at least one first photoluminescent organic compound is 5,6-diphenoxy-4,7-bis[5-(2,6-dimethylphenyl)-2-thienyl]benzo[c]1,2,5-thiadiazole (MPDTBOP).

More detailed information relating to said disubstituted benzoheterodiazole compounds and disubstituted diaryloxybenzoheterodiazole compounds may be found, for example, in international patent applications WO 2016/046310 and WO 2016/046319 in the name of the Applicant.

According to a preferred embodiment of the present disclosure, said at least one second photoluminescent organic compound may be selected, for example, from:

disubstituted benzoheterodiazole compounds such as, for example, 4,7-bis[5-(2,5-dimethoxyphenyl)-2-thienyl] benzo[c]1,2,5-thiadiazole, 4,7-bis[5-(2,6-dimethoxyphenyl)-2-thienyl]benzo[c]1,2,5-thiadiazole, 4,7-bis[5-(2,4-dimethoxyphenyl)-2-thienyl]benzo[c]1,2,5-thiadiazole, or mixtures thereof;

disubstituted diaryloxybenzoheterodiazole compounds such as, for example, 5,6-diphenoxy-4,7-bis[5-(2-naphthyl)-2-thienyl]benzo[c]1,2,5-thiadiazole, or mixtures thereof;

compounds comprising one benzoheterodiazole group and at least one benzodithiophene group such as, for example, 4,7-bis(7',8'-dibutyl-benzo[1',2'-b':4',3'-b"] dithien-5'-yl)-benzo[c][1,2,5]thiadiazole (F500), or mixtures thereof;

disubstituted naphthothiadiazole compounds such as, for example, 4,9-bis(7',8'-dibutyl-benzo[1',2'-b':4',3'-b"] dithien-5'-yl)-naphtho[2,3-c]-[1,2,5]-thiadiazole (F521), 4,9-bis(thien-2'-yl)-naphtho[2,3-c][1,2,5]thiadiazole (DTN), or mixtures thereof;

benzothiadiazole dithiophene compounds such as, for example, 4,7-bis(5-(thiophen-2-yl)thiophen-2-yl) benzo[c][1,2,5]thiadiazole (QTB), 4,7-di(5"-n-hexyl-2',2"-dithien-5'-yl)-2,1,3-benzothiadiazole (QTB-ex), or mixtures thereof;

perylene compounds such as, for example, N,N'-bis(2',6'-di-iso-propylphenyl)(1,6,7,12-tetraphenoxy)(3,4,9,10-perylene-diimide (Lumogen® F Red 305, from Basf), or mixtures thereof, compounds derived from the fluorone family such as, for example, compounds known by the commercial name Rhodamine 6G, Rhodamine 101, from Sigma-Aldrich, or mixtures thereof;

or mixtures thereof.

According to a further preferred embodiment of the present disclosure, said at least one second photoluminescent organic compound is N,N'-bis(2',6'-di-iso-propylphenyl)(1,6,7,12-tetraphenoxy)(3,4,9,10-perylene-diimide (Lumogen® F Red 305-Basf).

More detailed information relating to said compounds comprising a benzoheterodiazole group and at least one benzodithiophene group may be found, for example, in international patent application WO 2013/098726 in the name of the Applicant.

More detailed information relating to said disubstituted naphthohiadiazole compounds may be found, for example, in international patent application WO 2014/128648, in the name of the Applicant.

More detailed information relating to said benzothiadiazole dithiophene compounds, may be found, for example, in European patent application EP 2 557 606, in the name of the Applicant.

More detailed information relating to said disubstituted benzoheterodiazole and disubstituted diaryloxybenzoheterodiazole compounds may be found, for example, in the above-mentioned international patent applications WO 2016/046310 and WO 2016/046319 in the name of the Applicant.

According to a preferred embodiment of the present disclosure, said at least one third, optionally photoluminescent, organic compound, may be selected, for example, from:

phenothiazine compounds substituted with alkyl and/or alkyl amine groups such as, for example, the compound known by the commercial name Toluidine Blue from Sigma-Aldrich, or mixtures thereof;

phenoxazine compounds such as, for example, the compound known by the commercial name Nile Blue A from Sigma-Aldrich, or mixtures thereof;

anthraquinone compounds substituted with alkyl amine groups such as, for example, the compound known by the commercial name Oil Blue N from Sigma-Aldrich, or mixtures thereof;

or mixtures thereof.

According to a further preferred embodiment of the present disclosure, said at least one third organic compound is Oil Blue N form Sigma Aldrich.

According to a preferred embodiment of the present disclosure, in said at least one first sheet, said at least one first photoluminescent organic compound may be present in said matrix of a transparent material in a quantity within the range 10 ppm to 200 ppm, preferably within the range 12 ppm to 100 ppm, yet more preferably within the range 15 to 70 ppm.

According to a preferred embodiment of the present disclosure, in said at least one second sheet, said at least one second photoluminescent organic compound may be present in said matrix of a transparent material in a quantity within the range 5 ppm to 150 ppm, preferably within the range 7 ppm to 100 ppm, yet more preferably within the range 10 to 50 ppm.

According to a preferred embodiment of the present disclosure, in said at least one third sheet, said at least one third, optionally photoluminescent, organic compound may be present in said matrix of a transparent material in a quantity within the range 10 ppm to 100 ppm, preferably within the range 12 ppm to 60 ppm, yet more preferably within the range 15 to 40 ppm.

For the purpose of the present description and of the claims which follow, the term "ppm" indicates the milligrams (mg) of photoluminescent organic compound or of optionally photoluminescent organic compound per 1 kilogram (kg) of matrix of a transparent material.

It should be noted that, for the purpose of the present disclosure, as an indication, the quantity of photoluminescent organic compound or of optionally photoluminescent organic compound, to be used, may be obtained by applying the following equation (I) (i.e. Lambert-Beer law):

$$\text{Absorbance} = \varepsilon \times [dye] \times l \qquad (I)$$

wherein:
$\varepsilon$ is the molar extinction coefficient of the organic compound at a given wavelength ($\lambda$);
$l$ is the optical path.

The quantity necessary is obtained when the desired absorbance value has been established and the specific molar extinction coefficient value ($\varepsilon$) for each photoluminescent organic compound and for each optionally photoluminescent organic compound is known. Said quantity must be successively adjusted on account of the partial overlap of the absorption and emission bands of the above mentioned photoluminescent organic compound and optionally photoluminescent organic compound, which modifies the absorbance at certain wavelength values ($\lambda$), altering the overall coloration of the sheets.

According to a preferred embodiment of the present disclosure, said at least one first, at least one second and at least one third sheet may have a thickness within the range 1 mm to 8 mm, preferably within the range 2 mm to 6 mm.

The above mentioned photoluminescent or optionally photoluminescent organic compounds may be used in said luminescent solar concentrator (LSC) in a wide variety of forms.

For example, in the case wherein the matrix of a transparent material is of the polymeric type, said at least one photoluminescent organic compound or said at least one optionally photoluminescent organic compound may be dispersed within the polymer of said matrix of a transparent material, for example, by dispersion in the melt or addition by mass, and subsequent formation of a sheet comprising said polymer and said at least one photoluminescent organic compound or said at least one optionally photoluminescent organic compound, by working, for example, in accordance with the casting technique.

Alternatively, said at least one photoluminescent organic compound or said at least one optionally photoluminescent organic compound, and the polymer of said matrix of a transparent material may be solubilised in at least one suitable solvent, obtaining a solution that is deposited on a sheet made from said polymer, forming a film comprising said at least one photoluminescent organic compound or said at least one optionally photoluminescent organic compound, and said polymer, by working, for example, with use of a Doctor Blade type film applicator: said solvent is then left to evaporate. Said solvent may be selected, for example, from: hydrocarbons such as, for example, 1,2-dichlorobenzene, 1,2-dichloromethane, toluene, hexane; ketones such as, for example, acetone, acetylacetone; or mixtures thereof.

In the case wherein the matrix of a transparent material is of the glass type, said at least one photoluminescent organic compound or said at least one optionally photoluminescent organic compound may be solubilised in at least one suitable solvent (which may be selected from those given above), obtaining a solution that is deposited on a sheet of said glass type transparent matrix, forming a film comprising said at least one photoluminescent compound, working, for example, with the use of a Doctor Blade type film applicator: said solvent is then left to evaporate.

Alternatively, a sheet of said matrix of a transparent material of the polymeric type may be immersed in an aqueous microemulsion comprising said at least one photoluminescent organic compound or said at least one optionally photoluminescent organic compound, previously prepared. More detailed information relating to said microemulsions may be found, for example, in the American patent application U.S. Pat. No. 9,853,172 in the name of the Applicant.

Alternatively, a sheet comprising said at least one photoluminescent organic compound or said at least one optionally photoluminescent organic compound, and said polymer obtained as described in accordance with the casting technique, may be sandwiched between two sheets of said glass type transparent matrix by working in accordance with the known technique used for the preparation of double glazing in an inert atmosphere.

For the purpose of the present disclosure, said sheets may be made by using a Doctor Blade type film applicator, or by working in accordance with the casting technique: further details may be found in the examples which follow.

Subsequently, the sheets thus obtained are stacked and, in the case wherein said sheets are produced with the use of a Doctor Blade type film applicator, the larger surfaces in direct contact must be those on which the film comprising the photoluminescent organic compound or the optionally photoluminescent organic compound has been deposited.

A further object of the present disclosure is also a photovoltaic device (or solar device) comprising at least one photovoltaic cell (or solar cell), and at least one luminescent solar concentrator (LSC) of neutral coloration defined above.

Said photovoltaic device (o solar device) may be obtained, for example, by assembling the abovementioned luminescent solar concentrator with at least one photovoltaic cell (or solar cell).

For the purpose of the present disclosure, one or more photovoltaic cells (or solar cells) may be positioned externally to at least one of the sides of said luminescent solar concentrator (LSC), preferably said photovoltaic cells (or solar cells) may partially or completely cover the outer perimeter of said luminescent solar concentrator (LSC).

For the purpose of the present description and of the claims which follow, the term "outer perimeter" is intended to refer to the outer sides of said luminescent solar concentrator (LSC).

The present disclosure will now be illustrated in greater detail by means of an embodiment with reference to FIG. 1 below reported.

In particular, FIG. 1 represents the assembly of a luminescent solar concentrator (LSC) (D) in accordance with the present disclosure. For this purpose, the lower larger surface of a first sheet (1), said first sheet (1) comprising a matrix of a transparent material [e.g., poly(methyl methacrylate) (PMMA)] and a first photoluminescent organic compound [e.g., 5,6-diphenoxy-4,7-bis[5-(2,6-dimethylphenyl)-2-thienyl]benzo[c]1,2,5-thiadiazole (MPDTBOP)], is placed in direct contact with the upper larger surface of a second sheet (2), said second sheet (2) comprising a matrix of a transparent material [e.g., poly(methyl methacrylate) (PMMA)] and a second photoluminescent organic compound [e.g., N,N'-bis(2',6'-di-iso-propylphenyl)(1,6,7,12-tetraphenoxy)(3,4,9,10-perylene-diimide (Lumogen® F Red 305-Basf)]. Thereafter, a frame of photovoltaic cells (or solar cells) (4), connected in series and with a multimeter (5), is glued around the four outer sides of said two stacked sheets as stated above. Subsequently, the upper larger surface of a third sheet (3), said third sheet (3) comprising a matrix of a transparent material [e.g., poly(methyl methacrylate) (PMMA)] and a third, non-photoluminescent organic compound (e.g., Oil Blue N from Sigma Aldrich), is placed in direct contact with the lower larger surface of said second sheet (2). The upper larger surface of said first sheet (1) is the one closest to the photon source [i.e. solar radiation (S)] and the lower larger surface of said third sheet (3) is the one furthest away from the photon source [i.e. solar radiation (S)].

For the purpose of a better understanding of the present disclosure and of putting it into practice, here below a number of illustrative and non-limiting examples of the same are given.

EXAMPLE 1

Preparation of Sheet 1 (Film)

2 g of poly(methyl methacrylate) (PMMA) Altuglas VSUVT 100 (Arkema), and 7.4 mg of 5,6-diphenoxy-4,7-bis[5-(2,6-dimethylphenyl)-2-thienyl]benzo[c]1,2,5-thiadiazole (MPDTBOP), obtained as described in EXAMPLE 7 of international patent application WO 2016/046319 in the name of the Applicant mentioned above, were dissolved in 10 ml of 1,2-dichlorobenzene. The solution obtained was then deposited uniformly on a sheet of poly(methyl methacrylate) (PMMA) (dimensions 50×40×0.3 cm) with the use of a Doctor Blade type film applicator obtaining a film of dimensions 42×12 cm$^2$ and the solvent was left to evaporate at ambient temperature (25° C.), in a light air current, for 24 hours. A transparent sheet of yellow coloration (sheet 1) resulted, conferred thereto by the film the thickness of which was within the range 100 μm to 50 μm, from which were obtained four sheets of dimensions 9×9×0.3 cm, each containing 41 ppm of 5,6-diphenoxy-4,7-bis[5-(2,6-dimethylphenyl)-2-thienyl]benzo[c]1,2,5-thiadiazole (MPDTBOP).

EXAMPLE 2

Preparation of Sheet 2 (Film)

2 g of poly(methyl methacrylate) (PMMA) Altuglas VSUVT 100 (Arkema) and 4.9 mg of N,N'-bis(2',6'-di-iso-propylphenyl)(1,6,7,12-tetraphenoxy)(3,4,9,10-perylene-diimide (Lumogen® F Red 305-Basf), were dissolved in 10 ml of 1,2-dichlorobenzene. The solution obtained was then deposited uniformly on a sheet of poly(methyl methacrylate) (PMMA) (dimensions 50×40×0.3 cm) with the use of a Doctor Blade type film applicator obtaining a film of dimensions 42×12 cm$^2$ and the solvent was left to evaporate at ambient temperature (25° C.), in a light air current, for 24 hours. A transparent sheet of red coloration (sheet 2) resulted, conferred thereto by the film the thickness of which was within the range 100 μm to 50 μm, from which were obtained four sheets of dimensions 9×9×0.3 cm, each containing 27 ppm of N,N'-bis(2',6'-di-iso-propylphenyl)(1,6,7,12-tetraphenoxy)(3,4,9,10-perylene-diimide (Lumogen® F Red 305-Basf).

EXAMPLE 3

Preparation of Sheet 3 (Film)

2 g of poly(methyl methacrylate) (PMMA) Altuglas VSUVT 100 (Arkema) and 18.9 mg of Oil Blue N (Sigma-Aldrich), were dissolved in 10 ml of 1,2-dichlorobenzene. The solution obtained was then deposited uniformly on a sheet of poly(methyl methacrylate) (PMMA) (dimensions 50×40×0.3 cm) with the use of a Doctor Blade type film applicator obtaining a film of dimensions 42×12 cm$^2$ and the solvent was left to evaporate at ambient temperature (25° C.), in a light air current, for 24 hours. A transparent sheet of blue coloration (sheet 3) resulted, conferred thereto by the film the thickness of which was within the range 100 μm to 50 μm, from which were obtained four sheets of dimensions 9×9×0.3 cm, each containing 32.4 ppm of Oil Blue N (Sigma-Aldrich).

EXAMPLE 4

Preparation of Photovoltaic Device with Luminescent Solar Concentrator of Neutral Coloration (Grey-Film)

A photovoltaic device (according to FIG. 1) comprising a luminescent solar concentrator of neutral coloration was prepared by working as stated below.

Sheet 1 obtained as stated in EXAMPLE 1 and sheet 2 obtained as stated in EXAMPLE 2 were stacked in such a way that the larger surfaces covered by the film of photoluminescent organic compound were in direct contact one with the other and, subsequently, 16 photovoltaic cells of silicon IXYS-XOD17 each having dimensions 22×6 mm and a surface of 1.2 cm$^2$ (four photovoltaic cells on each side) were then glued to the four outer sides using silicone (Loctite SI-5366). Said photovoltaic cells were connected in series and then to a multimeter.

Lastly, the upper larger surface of sheet 3 (upper surface covered by the film of organic compound) obtained as stated in EXAMPLE 3, was placed in direct contact with the lower larger surface of said sheet 2.

The device thus obtained was subjected to colour analysis using a SpectraRad™ Xpress (mod.BSR112E) spectrometer together with suitable software (BWSpec Software) from BWTEK$_{inc}$ for colour codification.

Figure 2:
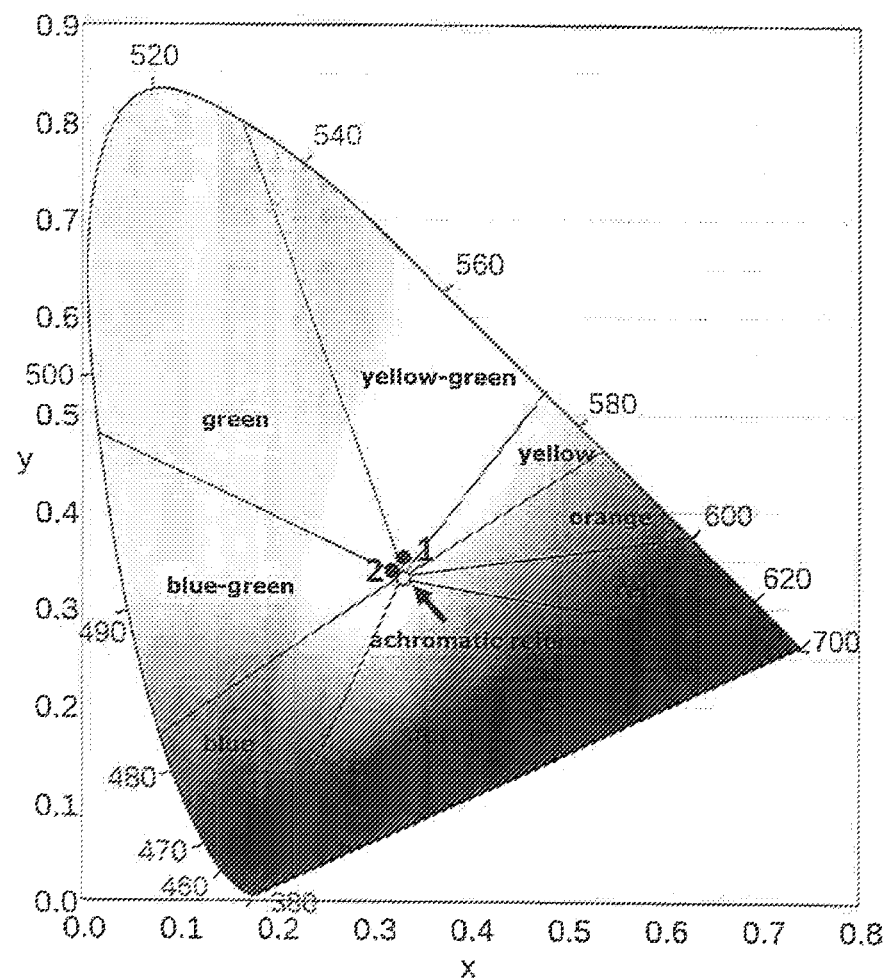
FIG. 2 is a graph of a radiance (or transmittance) spectrum obtained by luminescent solar concentrator (LSC) in accordance with the present disclosure.

To this end, the device was positioned at the outlet of an integrating sphere and was illuminated with a 300W OF (Ozone Free) Xenon lamp. The radiance (or transmittance) spectrum measured with the spectrometer was processed by the combined software using the colour model CIE1931: from this were obtained the chromatic coordinates x and y relating to the colour (denoted by 1 in FIG. 2, x on the abscissa and y on the ordinate axis) and the value of Y relating to luminosity which was found to be equal to 28%.

Figure 3:
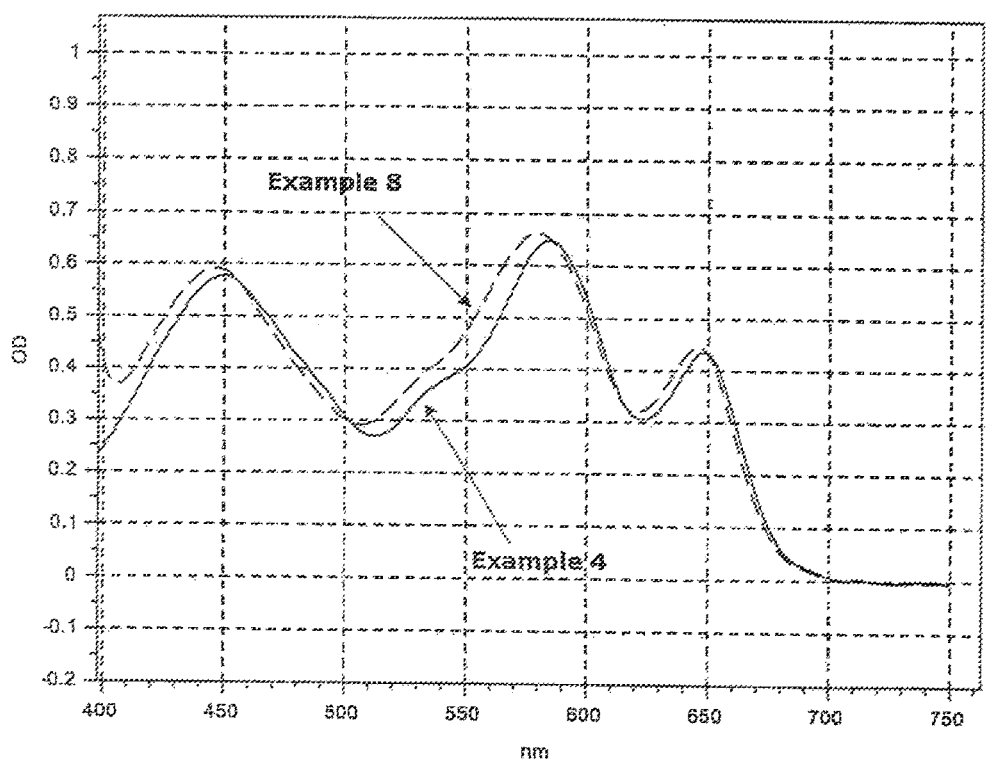
FIG. 3 is a plot of absorption spectrums as recorded for Examples 4 and 8 for a luminescent solar concentrator (LSC) in accordance with the present disclosure.

Instead, the absorption spectrum of the device was recorded by means of a Newport OSM400-DUV spectrometer using a 300W OF Xenon lamp as the source: the results obtained are presented in FIG. 3 in which the wavelength (k) in nm is shown on the abscissa (x axis) and the optical density (OD) is shown on the ordinate axis (y axis).

Finally, the device thus obtained was inserted into a sample holder and the upper larger surface of sheet 1 (i.e. that not covered with the film) was illuminated with a light source of power equal to 1 sun (1000 W/m$^2$), and the electrical potential generated by effect of the illumination was measured.

The power measurements were made by illuminating the entire surface of the photovoltaic device (corresponding to the exposed surface of sheet 1, i.e. 9×9 cm).

The current-voltage characteristics were obtained by applying an external voltage to each of said cells and measuring the photocurrent generated with a Keithley 2602A (3A DC, 10A Pulse) digital multimeter, obtaining the following values: maximum power measured relative to the illuminated surface ($P_{MAX}$) (expressed in mW), power normalized per m$^2$ (P) (expressed in W/m$^2$) obtained from the value of maximum power ($P_{MAX}$) and efficiency (E) calculated according to the following equation:

$$E(\%) = P \times 0.1$$

wherein the power (P) (expressed in W/m$^2$) and 0.1 corresponds to the maximum efficiency (100%) at 1 sun (1000 W/m$^2$).

The following results were obtained:
maximum power ($P_{MAX}$)=158.34 mW;
power (P)=19.5 W/m$^2$;
efficiency (E)=2%.

EXAMPLE 5

Preparation of Sheet 1b (Castinn)

1250 ml of methyl methacrylate (MMA) (Sigma-Aldrich), previously distilled to remove any polymerisation inhibitors, were heated in a 2 l flask under magnetic stirring, bringing the temperature to 80° C., in 2 hours. 125 mg of 2,2'-azo-bis[2-methylpropionamidine]dihydrochloride (AIBN) (initiator) dissolved in 125 ml of previously distilled methymethacrylate (MMA) (Sigma-Aldrich) were subsequently added: the temperature of the mixture obtained is lowered by about 3° C.-4° C. Said mixture was heated, bringing the temperature to 94° C. in 1 hour: the whole was left at said temperature for 2 minutes and subsequently cooled in an ice bath, obtaining a prepolymer syrup which, if not used immediately, may be stored for a few weeks in a refrigerator.

A mould was then prepared, assembled with two sheets of glass having a thickness of 10 mm and larger dimensions of 100×100 mm, separated by a polyvinylchloride (PVC) seal of larger diameter equal to 3 mm, held together with metal clamps.

A 500 ml glass flask was then filled with 250 ml of prepolymer syrup obtained as described above, 16 mg of lauroyl peroxide (Sigma-Aldrich) dissolved in 125 ml of methyl methacrylate (MMA) (Sigma-Aldrich), previously distilled, a quantity of 5,6-diphenoxy-4,7-bis[5-(2,6-dimethylphenyl)-2-thienyl]benzo [c]1,2,5-thiadiazole (MPDT-BOP) equal to 35 ppm, 5000 ppm of Tinuvin® P (Basf) and 5000 ppm of Tinuvin® 770 (Basf): the mixture obtained was maintained under magnetic stirring and in a vacuum (10 mm Hg), for 45 minutes, at ambient temperature (25° C.), obtaining a degassed solution. The solution thus obtained was poured into the mould prepared as described above which, once the opening in the seal had been closed, was immersed in a water bath at 55° C., for 48 hours. The mould was then placed in an oven at 95° C., for 24 hours (curing step) after which it was removed from the oven and left to cool at ambient temperature (25° C.). The metal clamps and the seal were then removed, and the glass sheets were separated by isolating sheet 1b (dimensions 75×75×3 mm).

EXAMPLE 6

Preparation of Sheet 2b (Casting)

Sheet 2b was prepared by working as stated in EXAMPLE 5, except that instead of 5,6-diphenoxy-4,7-bis [5-(2,6-dimethylphenyl)-2-thienyl]benzo[c]1,2,5-thiadiazole (MPDTBOP), N,N'-bis(2',6'-di-iso-propylphenyl)(1,6,7,12-tetraphenoxy)(3,4,9,10-perylene-diimide (Lumogen® F Red 305-Basf) was used in a quantity equal to 21.6 ppm, obtaining sheet 2b (dimensions 75×75×3 mm).

EXAMPLE 7

Preparation of Sheet 3b (Casting)

Sheet 3b was prepared by working as stated in EXAMPLE 5, except that instead of 5,6-diphenoxy-4,7-bis [5-(2,6-dimethylphenyl)-2-thieny]benzo[c]1,2,5-thiadiazole (MPDTBOP), Oil Blue N (Sigma-Aldrich) was used in a quantity equal to 26.5 ppm, obtaining sheet 3b (dimensions 75×75×3 mm).

EXAMPLE 8

Preparation of Photovoltaic Device with Luminescent Solar Concentrator of Neutral Coloration (Grey 1—Casting)

A photovoltaic device (according to FIG. 1) was prepared, comprising a luminescent solar concentrator of neutral coloration, working as stated below.

Sheet 1b obtained as stated in EXAMPLE 5 and sheet 2b obtained as stated in Example 6 were stacked in direct contact one with the other, and 12 photovoltaic cells of silicon IXYS-XOD17, each having dimensions 22×6 mm and an active surface of 1.2 cm$^2$ (three photovoltaic cells per each side—not shown in FIG. 1, in which four cells per each side are shown), were then glued at the four outer sides using silicone (Loctite SI-5366). Said photovoltaic cells were connected in series and thereafter to a multimeter.

Lastly, sheet 3b, obtained as stated in EXAMPLE 7, was superimposed on sheet 2b.

The device thus obtained was subjected to colour analysis by working as stated in EXAMPLE 4: from this were obtained the chromatic coordinates x and y relating to the colour (denoted by 2 in FIG. 2, x on the abscissa and y on the ordinate axis) and the value of Y relating to luminosity which was found to be equal to 30%.

The absorption spectrum of the device was recorded by working as stated in Example 4: the results obtained are presented in FIG. 3 in which the wavelength (k) in nm is shown on the abscissa (x axis) and the optical density (OD) is shown on the ordinate axis (y axis).

Finally, the device thus obtained was inserted into a sample holder and the upper larger surface of sheet 1b was illuminated with a light source of power equal to 1 sun (1000 W/m$^2$), and the electrical potential generated by effect of the illumination was measured.

The power measurements were made by illuminating the entire surface of the photovoltaic device (corresponding to the exposed surface of sheet 1b, i.e. 75×75 mm).

The current-voltage characteristics were obtained by working as described in EXAMPLE 4, and the results obtained are as follows:
maximum power ($P_{MAX}$)=62.55 mW;
power (P)=11.1 W/m$^2$;
efficiency (E)=1.1%.

EXAMPLE 9

Preparation of Sheet 1c (Casting)

A prepolymer syrup was obtained by working as stated in EXAMPLE 5.

A mould was then prepared, assembled with two sheets of glass having a thickness of 10 mm and larger dimensions of 300×300 mm, separated by a polyvinylchloride (PVC) seal of larger diameter equal to 3 mm, held together with metal clamps.

A 1000 ml glass flask was then filled with 750 ml of prepolymer syrup obtained as stated in EXAMPLE 5, 48 mg of lauroyl peroxide (Sigma-Aldrich) dissolved in 125 ml of methyl methacrylate (MMA) (Sigma-Aldrich), previously distilled, a quantity of 5,6-diphenoxy-4,7-bis[5-(2,6-dimethylphenyl)-2-thienyl]benzo [c]1,2,5-thiadiazole (MPDTBOP) equal to 35 ppm (mg of dye/kg MMA), 5000 ppm of Tinuvin® P (Basf) and 5000 ppm of Tinuvin® 770 (Basf): the mixture obtained was maintained under magnetic stirring and under vacuum (10 mm Hg) for 45 minutes, at ambient temperature (25° C.), obtaining a degassed solution. The solution thus obtained was poured into the mould prepared as described above which, once the opening of the seal had been closed, was immersed in a water bath at 55° C., for 48 hours. The mould was then placed in an oven at 95° C., for 24 hours (curing step) after which it was removed from the oven and left to cool at ambient temperature (25° C.). The metal clamps and the seal were then removed, and the glass sheets were separated by isolating sheet c (dimensions 250×250×3 mm).

EXAMPLE 10

Preparation of Sheet 2c (Casting)

Sheet 2c was prepared by following the same procedure stated in EXAMPLE 9, except that instead of 5,6-diphenoxy-4,7-bis[5-(2,6-dimethylphenyl)-2-thienyl]benzo[c]1,2,5-thiadiazole (MPDTBOP), N,N'-bis(2',6'-di-iso-propylphenyl)(1,6,7,12-tetraphenoxy)(3,4,9,10-perylene-diimide (Lumogen® F Red 305-BASF) was used in a quantity equal to 21.6 ppm (mg dye/kg MMA), obtaining sheet 2c (dimensions 250×250×3 mm).

EXAMPLE 11

Preparation of Sheet 3c (Casting)

Sheet 3c was prepared by following the same procedure stated in EXAMPLE 9, except that instead of 5,6-diphenoxy-4,7-bis[5-(2,6-dimethylphenyl)-2-thienyl]benzo[c]1,2,5-thiadiazole (MPDTBOP), Oil Blue N (Sigma-Aldrich) was used in a quantity equal to 26.5 ppm (mg dye/kg MMA), obtaining sheet 3b (dimensions 250×250×3 mm).

EXAMPLE 12

Preparation of Photovoltic Device with Luminescent Solar Concentrator of Neutral Coloration (Grey 2—Casting)

A photovoltaic device was prepared (according to FIG. 1) comprising a luminescent solar concentrator of neutral coloration, working as stated below.

Sheet 1c obtained as stated in EXAMPLE 9 and sheet 2c obtained as stated in Example 10 were stacked in direct contact one with the other, and 4 photovoltaic cells of silicon IXYS-SLMD142H01LE, each having dimensions 247×6 mm and an active surface of 14.7 cm$^2$ (one photovoltaic cell per each side—not shown in FIG. 1, in which four cells per each side are shown) were then glued to the four outer sides using silicone (Loctite SI-5366). Said photovoltaic cells were connected in series and thereafter to a multimeter.

Lastly, the upper larger surface of sheet 3c obtained as stated in EXAMPLE 11 was placed in direct contact with the lower larger surface of said sheet 2c.

The device thus obtained was arranged externally on an inserted support and exposed directly to the sun with the upper larger surface of sheet 1c turned towards the light (i.e. closer to the photon source) and the electrical potential generated by effect of the solar illumination was measured.

The measurements of power were carried out by illuminating the entire surface of the photovoltaic device (corresponding to the surface of exposed sheet 1c, i.e. 250×250 mm).

The current-voltage characteristics were obtained by operating as described in EXAMPLE 4, and the results obtained are as follows:

maximum power ($P_{MAX}$)=13.97 mW;
power (P)=14.0 W/m$^2$;
efficiency (E)=1.4%.

The invention claimed is:

1. A method of making a luminescent solar concentrator comprising:
    forming at least one first sheet of a matrix of a transparent material and at least one first photoluminescent organic compound having an absorption interval within the range 420 nm to 550 nm and an emission interval within the range 500 nm to 650 nm;
    forming at least one second sheet of a matrix of a transparent material and at least one second photoluminescent organic compound having an absorption interval within the range 480 nm to 650 nm and an emission interval within the range 580 nm to 750 nm;
    forming at least one third sheet of a matrix of a transparent material and at least one third, optionally photoluminescent, organic compound having an absorption interval within the range 570 nm to 750 nm and an emission interval within the range 700 nm to 900 nm, wherein the at least one first sheet, the at least one second sheet, and the at least one third sheet are separately cast in a mould; and
    stacking the at least one first sheet, the at least one second sheet, and the at least one third sheet in sequence,
    wherein the luminescent solar concentrator is of neutral coloration,
    wherein each of said at least one first sheet, at least one second sheet and at least one third sheet has one upper surface, one lower surface and one or more outer sides,
    wherein the surface area of said one upper surface and one lower surface are larger than said one or more outer sides,
    wherein the lower surface of said at least one first sheet is in direct contact with the upper surface of said at least one second sheet, the lower surface of said at least one second sheet is in direct contact with the upper surface of said at least one third sheet.

2. The method of making a luminescent solar concentrator according to claim 1, wherein said transparent material of each of said at least one first sheet, at least one second sheet, and at least one third sheet is selected from the group consisting of transparent polymers poly(methyl methacrylate), polycarbonate , poly(isobutyl methacrylate), poly(ethyl methacrylate), poly(allyldiglycol carbonate), polymethacrylimide, polycarbonate ether, polyethylene terephthalate, polyvinyl butyral, ethylene-vinyl acetate copolymers, ethylene-tetrafluoroethylene copolymers, polyimide, polyurethane, styrene-acrylonitrile copolymers, styrene-butadiene copolymers, polystyrene, methyl-methacrylate styrene copolymers, polyethersulfone, polysulfone, cellulose triacetate, transparent and impact-resistant crosslinked acrylic compositions consisting of a fragile matrix (I) having a glass transition temperature ($T_g$) above 0° C. and elastomeric domains having dimensions smaller than 100 nm which consist of macromolecular sequences (II) having a flexible nature with a glass transition temperature ($T_g$) below 0° C. and mixtures thereof and transparent glass selected from the group consisting of silica, quartz, alumina, titanium, and mixtures thereof.

3. The method of making a luminescent solar concentrator according to claim 1, wherein said at least one first photoluminescent organic compound is selected from the group consisting of:
    one or more benzothiadiazole compounds;
    one or more disubstituted benzoheterodiazole compounds;
    one or more disubstituted diaryloxybenzoheterodiazole compounds;
    one or more perylene and perylenimide compounds;
    one or more benzopyranone compounds; and and mixtures thereof.

4. The method of making a luminescent solar concentrator according to claim 1, wherein said at least one second photoluminescent organic compound is selected from the group consisting of:
    one or more disubstituted benzoheterodiazole compounds;
    one or more disubstituted diaryloxybenzoheterodiazole compounds;
    one or more compounds comprising one benzoheterodiazole group and at least one benzodithiophene group;
    one or more disubstituted naphtathiadiazole compounds;
    one or more benzothiadiazole dithiophene compounds;
    one or more perylene compounds;
    one or more compounds derived from the fluorone family; and mixtures thereof.

5. The method of making a luminescent solar concentrator according to claim 1, wherein said at least one third, optionally photoluminescent, organic compound is selected from the group consisting of:
    one or more phenothiazine compounds substituted with alkyl and/or alkyl amine groups;
    one or more phenoxazine compounds;
    one or more anthraquinone compounds substituted with alkyl amine groups; and any mixtures thereof.

6. The method of making a luminescent solar concentrator according to claim 1, wherein, in said at least one first sheet, said at least one first photoluminescent organic compound is present in said matrix of a transparent material in a quantity within the range 10 ppm to 200 ppm.

7. The method of making a luminescent solar concentrator according to claim 1, wherein, in said at least one second sheet, said at least one second photoluminescent organic compound is present in said matrix of a transparent material in a quantity within the range 5 ppm to 150 ppm.

8. The method of making a luminescent solar concentrator according to claim 1, wherein, in said at least one third sheet, said at least one third, optionally photoluminescent, organic compound is present in said matrix of a transparent material in a quantity within the range 10 ppm to 100 ppm.

9. The method of making a luminescent solar concentrator according to claim 1, wherein each of said at least one first sheet, at least one second sheet and at least one third sheet have a thickness within the range 1 mm to 8 mm.

10. A method of making a photovoltaic device (or solar device) comprising providing at least one luminescent solar concentrator according to the method of claim 1; contacting a frame of a plurality of photovoltaic cells (or solar cells) with said one or more outer sides of said at least one first sheet, said at least one second sheet and said at least one third sheet of said at least one luminescent solar concentrator; and connecting the plurality of photovoltaic cells (or solar cells) in series to a multimeter.

11. The method of making a luminescent solar concentrator according to claim 1, wherein said at least one first photoluminescent organic compound has an absorption interval within the range 420 nm to 500 nm and an emission interval within the range 520 nm to 620 nm, wherein said at least one second photoluminescent organic compound has an absorption interval within the range 480 nm to 600 nm and an emission interval within the range 600 nm to 700 nm, and wherein said at least one third, optionally photoluminescent, organic compound has an absorption interval within the range 570 nm to 700 nm and an emission interval within the range 740 nm to 850 nm.

12. The method of making a luminescent solar concentrator according to claim 2, wherein said transparent material of each of said at least one first sheet, at least one second sheet, and at least on third sheet is a transparent polymer selected from the group consisting of poly(methyl methacrylate, impact-resistant poly(methyl methacrylate, or mixtures thereof, and wherein said transparent material has a refractive index within the range 1.30 to 1.70.

13. The method of making a luminescent solar concentrator according to claim 3, wherein said one or more benzothiadiazole compounds is 4,7-di(thien-2'-yl)-2,1,3-benzothiadiazole; wherein said one or more disubstituted benzoheterodiazole compounds is selected from the group consisting of 4,7-bis[5-(2,6-dimethylphenyl)-2-thienyl]benzo[c]1,2,5-thiadiazole, 4,7-bis[5-(2,6-di-iso-propylphenyl)-2-thienyl]benzo[c]1,2,5-thiadiazole, 4,7-bis[4,5-(2,6-dimethylphenyl)-2-thienyl]benzo[c]1,2,5-thiadiazole, and mixtures thereof; wherein said one or more disubstituted diaryloxybenzoheterodiazole compounds is selected from the group consisting of 5,6-diphenoxy-4,7-bis(2-thienyl)-2,1,3-benzothiadiazole, 5,6-diphenoxy-4,7-bis[5-(2,6-dimethylphenyl)-2-thienyl]benzo[c]1,2,5-thiadiazole, 5,6-diphenoxy-4,7-bis[5-(2,5-dimethylphenyl)-2-thienyl]benzo[c]1,2,5-thiadiazole, 5,6-diphenoxy-4,7-bis[5-(2,5-dimethylphenyl)-2-thienyl]benzo[c]-1,2,5-thiadiazole, 5,6-diphenoxy-4,7-bis[5-(2,6-diisopropyl-phenyl)-2-thienyl]benzo[c]1,2,5-thiadiazole, and mixtures thereof; wherein said one or more perylene and perylenimide compounds is selected from the group consisting of Lumogen® F083, Lumogen® F170, Lumogen® F240, and mixtures thereof; and wherein said one or more benzopyranone compounds selected from the group consisting of Coumarin 6, Coumarin 30, of Acros, and mixtures thereof.

14. The method of making a luminescent solar concentrator according to claim 4, wherein said one or more disubstituted benzoheterodiazole compounds is selected from the group consisting of 4,7-bis[5-(2,5-dimethoxyphenyl)-2-thienyl]benzo[c]1,2,5-thiadiazole, 4,7-bis[5-(2,6-dimethoxy-phenyl)-2-thienyl]benzo[c]1,2,5-thiadiazole, 4,7-bis[5-(2,4-dimethoxyphenyl)-2-thienyl]benzo[c]1,2,5-thiadiazole and mixtures thereof; wherein said one or more disubstituted diaryloxybenzoheterodiazole compounds is 5,6-diphenoxy-4,7-bis[5-(2-naphthyl)-2-thienyl]benzo[c]1,2,5-thiadiazole; wherein said one or more compounds comprising one benzoheterodiazole group and at least one benzodithiophene group is 4,7-bis(7',8'-dibutyl-benzo[1',2'-b':4',3'-b"]dithien-5'-yl)-benzo[c][1,2,5]thiadiazole; wherein said one or more disubstituted naphtathiadiazole compounds is selected from the group consisting of 4,9-bis(7',8'-dibutyl-benzo[1',2-b':4',3'-b"]dithien-5'-yl)-naphtho[2,3-c] [1,2,5] thiadiazole, 4,9-bis(thien-2'-yl)-naphtho[2,3-c][1,2,5]thiadiazole and a mixture thereof; wherein said one or more benzothiadiazole dithiophene compounds is selected from the group consisting of 4,7-bis(5-(thiophen-2-yl)thiophen-2-yl)benzo[c][1,2,5]thiadiazole, 4,7-di(5"-n-hexyl-2',2"-dithien-5'-yl)-2,1,3-benzothiadiazole and a mixture thereof; wherein said one or more perylene compounds is N,N'-bis (2',6'-di-iso-propylphenyl)(1,6,7,12-tetraphenoxy)(3,4,9,10-perylene-diimide); and wherein said one or more compounds derived from the fluorone family is selected from the group consisting of Rhodamine 6G, Rhodamine 101 or a mixture thereof.

15. The method of making a luminescent solar concentrator according to claim 5, wherein said one or more phenothiazine compounds substituted with alkyl and/or alkyl amine groups is Toluidine Blue; wherein said one or more phenoxazine compounds is Nile Blue A; and wherein said one or more anthraquinone compounds substituted with alkyl amine groups is Oil Blue N.

* * * * *